United States Patent [19]

Yamamoto et al.

[11] Patent Number: 4,877,756
[45] Date of Patent: Oct. 31, 1989

[54] METHOD OF PACKAGING A SEMICONDUCTOR LASER AND PHOTOSENSITIVE SEMICONDUCTOR DEVICE

[75] Inventors: Isamu Yamamoto; Jiro Fukushima, both of Itami, Japan

[73] Assignee: Mitsubishi Denki Kabushiki Kaisha, Japan

[21] Appl. No.: 175,356

[22] Filed: Mar. 30, 1988

[30] Foreign Application Priority Data

Mar. 31, 1987 [JP] Japan .................................. 62-79935

[51] Int. Cl.⁴ ............................................. H01L 21/56
[52] U.S. Cl. ..................................... 437/209; 437/220; 437/206; 437/2; 206/330; 357/19; 29/833
[58] Field of Search .................. 437/225, 209; 29/833; 357/19; 174/52.2; 206/330

[56] References Cited

U.S. PATENT DOCUMENTS

| | | | |
|---|---|---|---|
| 3,264,712 | 5/1963 | Teruo Hayashi et al. | 437/220 |
| 3,611,061 | 10/1971 | Segerson | 437/220 |
| 4,160,308 | 7/1979 | Courtney et al. | 437/220 |
| 4,641,418 | 2/1987 | Meddles | 437/220 |

*Primary Examiner*—Brian E. Hearn
*Assistant Examiner*—Beverly A. Pawlikowski
*Attorney, Agent, or Firm*—Leydig, Voit & Mayer

[57] ABSTRACT

A method of constructing a semiconductor laser includes producing a lead frame having a central lead which is used as a die pad at its central portion and two outside leads connected to the central lead by tie bars, mounting a semiconductor laser chip and a light receiving chip on the central lead of the lead frame, connecting the semiconductor laser chip and the light receiving chip to respective outside leads with wires, sealing portions of the leads, the wires, and both chips in a transparent package, and cutting the tie bars to disconnect the outside leads from the central lead.

9 Claims, 1 Drawing Sheet

METHOD OF PACKAGING A SEMICONDUCTOR LASER AND PHOTOSENSITIVE SEMICONDUCTOR DEVICE

FIELD OF THE INVENTION

The present invention relates to a method of constructing a semiconductor laser, and more particularly to that for a semiconductor laser which is used in a pick up device for a compact disc player.

BACKGROUND OF THE INVENTION

A semiconductor laser constructed by a prior art construction method is shown in FIG. 2. In FIG. 2, the reference numeral 1 designates a circular attachment plate to which a semiconductor laser chip and a SPD (sensitive photo diode) chip are mounted. The reference numeral 2 designates a cathode terminal for a semiconductor laser chip, and the reference numeral 3 designates an anode terminal for a SPD. The reference numeral 4 designates a Kovar cap having a laser light transparent window 5, and this cap 4 is welded to the circular attachment plate 1 by ring projection welding. The reference numeral 6 designates an iron block stem which is gilded. The this block stem 6 is provided on the circular attachment plate 1 contained in the inside of the cap 4. The reference numeral 7 designates a semiconductor laser chip mounted on the block stem 6 via the silicon submount 8. The reference numeral 9 designates a monitoring SPD chip fixed at a predetermined position on the attachment plate 1 in the neighborhood of the semiconductor laser chip 7. The attachment surface for the SPD chip 9 is a surface inclined relative to the attachment plate 1 so that reflected light is not incident on the semiconductor laser chip 7. The reference numeral 10 designates a lens attached to the window 5 of the cap 4. The reference numeral 11 designates wires such as gold wires for connecting the semiconductor semicondrctor laser chip 7 to the cathode terminal 2 and the SPD chip 9 to the anode terminal 3. The reference numeral 12 designates an anode terminal for the laser chip 7.

A method of constructing a semiconductor laser of such a construction will be described in the following.

At first, a block stem 6 is fixed onto a predetermined position of the attachment plate 1. Next, a semiconductor laser chip 7 is fixed onto the block stem 6 via the silicon submount 8, and the SPD chip 9 is mounted onto the attachment surface for SPD. Thereafter, the semiconductor laser chip 7 and the cathode terminal 2, and the SPD chip 9 and the anode terminal 3, are respectively connected by wires 11. Then, the cap 4 is fixed onto the attachment plate 1 by ring projection welding to seal the semiconductor laser chip 7, the SPD chip 9, and the like.

In this way, a semiconductor laser is constructed.

In such a prior art construction method of a semiconductor laser, however, there were drawbacks in that the construction work is complicated as well as expensive since the block stem 6, the cathode terminal 2, and the anode terminal 3 are separate parts, the respective bonding surfaces are positioned in different planes, and the cap 4 is fixed to the attachment plate 1 by the ring projection welding.

SUMMARY OF THE INVENTION

An object of the present invention is to provide a method of constructing a semiconductor laser-capable of simplifying the construction work and reducing its cost.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a lead frame including a central lead having a die pad at its central portion and two leads provided at the both sides of the central lead and connected to the central lead is produced, a semiconductor laser chip and a light receiving chip are bonded onto the central lead of the lead frame, and thereafter portions of the leads, wires, and the both chips are plastic sealed by a transparent package, and the tie bars of the lead frame are cut.

DETAILED DESCRIPTION OF THE PREFERRED EMBODIMENTS

Figure 1:
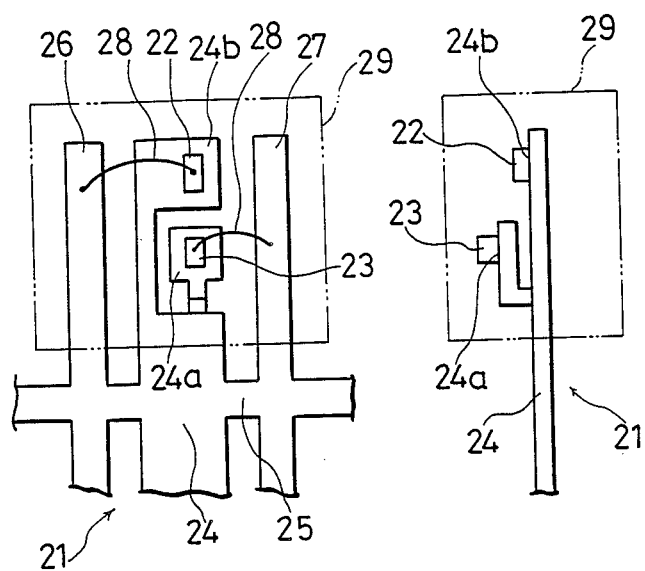
FIGS. 1(a), 1(b), and 1(c) are a plan and two side views of; a method of constructing a semiconductor laser as an embodiment of the present invention.

In FIGS. 1(a), 1(b), and 1(c), the reference numeral 21 designates a lead frame comprising metal of such as Kovar. This lead frame 21 has a lead having two die pads for fixing the semiconductor laser chip 22 and the SPD chip 23, and two leads 26 and 27 as a cathode terminal for the semiconductor laser chip 22 and an anode terminal for the SPD 23, and is produced in a predetermined configuration by such as punching The reference numeral 28 designates wires such as gold wires, and provided to connect the semiconductor laser chip 22 to the lead 26 and the SPD chip 23 to the lead 27. The reference numeral 29 designates a transparent package comprising such as MG-18 resin which is a product of Toray Hysole CO., Ltd., and this plastic package seals the lead frame 21, the semiconductor laser chip 22, the SPD chip 23, and the leads 26 and 27.

Next, the method of constructing this semiconductor laser will be described in the following.

At first, a lead frame 21 having a lead 24 having two die pads 24a, 24b at the central portion and two leads 26 and 27 which are provided at the both sides of the lead 24 and are connected to the lead 24 by the tie bars 25 is produced. Thereafter, the semiconductor laser chip 22 and the SPD chip 23 are attached to the respective predetermined positions on the die pads 24a, 24b of the lead 24 of the lead frame 21. Thereafter, in accordance with the device design, the lead 24 of the lead frame 21 is bent to incline the SPD chip attachment surface 24a by a predetermined angle relative to the laser chip attachment surface 24b as shown in FIG. 1(c). In the state of FIG. 1(b) or FIG. 1(c), the SPD chip 23 and the semiconductor laser chip 22 are connected to the leads 27 and 26, respectively. Respective portions of the leads 26 and 27, the wires 28, the laser chip 22 and the SPD 23 are sealed in a transparent package 29 by a transfer molding method, and the tie bars 25 of the lead frame 21 are cut.

In the embodiment of the present invention, a semiconductor laser chip 22 and a SPD 23 are mounted on the same lead frame 21, and the respective wire bonding surfaces are positioned in the same place. This enhances the reliability of the wire bonding and the work efficiency to a great extent.

Figure 2:
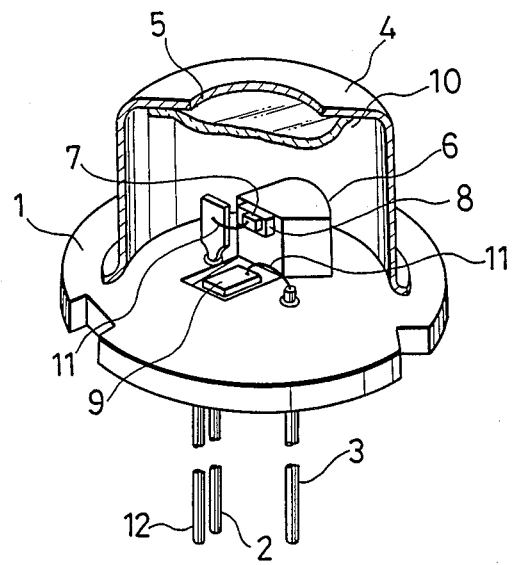
FIG. 2 is a perspective view showing a semiconductor laser partially broken away according to a prior art method of constructing a semiconductor laser.

In the above illustrated embodiment, portions of the semiconductor laser chip 22, the SPD 23, and the leads 26 and 27 are plastic sealed by a transparent package 29, but the present invention is not restricted to such a device. For example, by producing the top surface of the transparent package 29 in a concave surface configuration, it is possible to provide the laser with a lens function so as to reduce the number of parts relative to the above-described prior art embodiment of FIG. 2.

In the above-described embodiment, the process of inclining the SPD chip attachment surface 24a of the lead 24 is performed after the semiconductor laser chip 22 and the SPD 23 are mounted on the lead frame 21, but the process can be performed before the chips are mounted.

In the above-illustrated embodiment, the transparent package 29 is produced by a transfer molding method, but it may be produced by a potting method.

As is evident from the foregoing description, according to the present invention, a lead frame having a central lead which is used as a die pad at its central portion and two leads connected to the central lead by tie bars at the both sides of the central lead is produced, a semiconductor chip and a light receiving chip are mounted on the central lead of the lead frame and connected to the respective leads at the both sides by wires, and thereafter, portions of these leads, wires, and the both chips are plastic molded by a transparent package, and the tie bars of the lead frame are cut. Accordingly, there is no necessity of providing a block stem, a cathode terminal, and an anode terminal separately as in the prior art device, and it is also possible to postion the respective wire bonding surfaces in the same plane, thereby to simplifying the production work and reducing its cost. Furthermore, it is possible to produce a plurality of transparent packages simultaneously by the use of a lead frame.

What is claimed is:

1. A method of packaging a semiconductor laser and photosensitive semiconductor device together comprising:

producing a lead frame having a central lead which is used as a die pad at spaced apart first and second regions for a semiconductor laser and a photosensitive semiconductor device, respectively, and first and second outside leads spaced from said central lead and connected by tie bars to said central lead;

mounting the semiconductor laser and the photosensitive device on the respective first and second regions of said central lead of said lead frame;

bending the first region of said central lead relative to the second region of said central lead so that the first and second regions do not lie in the same plane;

electrically connecting the semiconductor laser and the photosensitive device to the respective first and second outside leads with wires;

sealing said laser and photosensitive device and portions of said leads and the wires in a transparent package; and cutting said tie bars to electrically disconnect said first and second outside leads from said central lead.

2. The method of claim 1 including forming said transparent package with a concave surface as a lens for at least one of the laser and the photosensitive semiconductor device.

3. The method of claim 1 including forming said transparent package by transfer molding.

4. The method of claim 2 including forming said transparent package by transfer molding.

5. The method of claim 1 including forming said transparent package by potting.

6. The method of claim 2 including forming said transparent package by potting.

7. The method of claim 1 including bending the first region of said central lead relative to the second region of said central lead to form an acute angle therebetween.

8. The method of claim 1 including bending the first region of said central lead relative to the second region of said central lead so that the regions lie in substantially parallel planes.

9. The method of claim 1 including bending the first region of said central lead relative to the second region before mounting the semiconductor laser and the photosensitive device on the respective regions of said central lead.

* * * * *